United States Patent [19]
Yamazaki et al.

[11] Patent Number: 5,225,367
[45] Date of Patent: Jul. 6, 1993

[54] METHOD FOR MANUFACTURING AN ELECTRONIC DEVICE

[75] Inventors: Shunpei Yamazaki, Tokyo; Kenji Itoh, Zama; Masaya Kadono, Atsugi; Naoki Hirose, Shimonoseki, all of Japan

[73] Assignee: Semiconductor Energy Laboratory Co., Ltd., Atsugi, Japan

[21] Appl. No.: 567,398

[22] Filed: Aug. 15, 1990

[30] Foreign Application Priority Data

Aug. 17, 1989 [JP] Japan ............................ 1-211800

[51] Int. Cl.$^5$ .............................................. H01L 21/26
[52] U.S. Cl. ...................................... 437/173; 437/160; 437/19
[58] Field of Search ........................ 437/19, 173, 160

[56] References Cited

U.S. PATENT DOCUMENTS

| | | | |
|---|---|---|---|
| 3,420,719 | 1/1969 | Potts | 437/19 |
| 4,619,036 | 10/1986 | Havemann et al. | 437/19 |
| 4,621,411 | 11/1986 | Havemann et al. | 437/19 |
| 4,734,386 | 3/1988 | Kubota et al. | 437/160 |

FOREIGN PATENT DOCUMENTS

| | | | |
|---|---|---|---|
| 2467486 | 5/1981 | France | 437/19 |
| 52221 | 4/1980 | Japan | 437/19 |
| 12321 | 1/1983 | Japan | 437/19 |

*Primary Examiner*—Brian E. Hearn
*Assistant Examiner*—Linda J. Fleck
*Attorney, Agent, or Firm*—Sixbey, Friedman, Leedom & Ferguson

[57] ABSTRACT

A method of manufacturing an electronic device using boron nitrides comprises the steps of adding impurities in boron nitrides by ion implantation to form a doped region and directing a laser beam onto the doped region while the boron nitrides are placed in a vacuum or a non-oxidizing atmosphere.

15 Claims, 3 Drawing Sheets

METHOD FOR MANUFACTURING AN ELECTRONIC DEVICE

BACKGROUND OF THE INVENTION

1. Field of the Invention

The present invention relates to a method for manufacturing an electronic device using boron nitrides, specifically a method wherein impurities are implanted in a boron nitride layer by ion implantation and the boron nitride layer is then subjected to laser annealing.

2. Description of the Prior Art

Since research relating to electronic devices using boron nitrides is in its early stages, many potential applications of boron nitrides to transistors and integrated circuits are expected. The first step has been developed in applications for diodes, and the applications of diodes have been related to devices emitting blue visible light or ultraviolet rays.

Research into fabricating light emitting devices or other types of electronic devices using boron nitrides has already been disclosed by Mr. Osamu Mishima, for example, in "New Diamonds" Vol. 4, No. 3, Pages 21 to 25. However, there was no disclosure of a method for producing the light emitting device using boron nitrides involving addition of impurities by ion implantation and subjection of the boron nitrides to laser annealing. There was also no disclosure of a method for annealing the boron nitrides by a pulsed laser beam.

In addition, research into the location and temperature relating to the implantation of the impurities in the boron nitrides under precise control has been completely lacking. Ion implantation is believed to be particularly effective in adding impurities into boron nitrides, but because these boron nitrides are synthesized in a non-equilibrium state, it is known that simply using ion implantation with subsequent heat annealing only, as in the case of a silicon semiconductor, is not effective. Also, when heat annealing is performed under a vacuum at 1400 degrees Centigrade, the lattice defects resulting from ion implantation cannot perfectly be eliminated since this heat annealing is an equilibrium annealing.

For this reason, it was impossible to control valence electrons in boron nitrides suitably in the same way as in a silicon semiconductor.

In the case of a silicon semiconductor, after the silicon semiconductor is ion implanted, it is annealed simply by heating to convert to the single crystal, so that in the activation of the impurities (conversion to donor or acceptor) which occurs at the same time, the silicon is melted in the equilibrium system, and the transfer of elements such as silicon in the long range order occurs for recrystallization.

Because the optical energy band gap of a boron nitride is 6.4 eV or greater, the boron nitride transmits a light emitted from a halogen lamp or the like which has an optical energy band gap of the 1 to 1.5 eV range. In this case the boron nitride is annealed in an equilibrium state by the halogen lamp or the like and the annealing is not enough.

SUMMARY OF THE INVENTION

An object of the present invention is to provide, with due consideration to the drawbacks of such conventional methods, an electronic device using boron nitrides.

This object is achieved in the present invention by the provision of a method for manufacturing an electronic device having boron nitrides wherein impurities are added in the boron nitrides by ion implantation and wherein the laser beam is directed onto the boron nitrides. By the laser beam the lattice defects from the existence of a dangling bond can be reduced or eliminated and the added impurities are activated and an impurity atom is substituted for a boron or nitrogen atom to combine with boron or nitrogen atoms in the boron nitrides. Thus the boron nitrides are annealed in a non-equilibrium state by the laser beam. And in this case the laser beam is directed onto the boron nitride in a vacuum or in an atmosphere of an inert gas, e.g. helium, neon, argon, krypton, xenon, or radon, or hydrogen gas of 4N or greater in order to avoid an oxidation of the boron nitrides. (The 4N means a purity not less than 99.99%.)

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1:
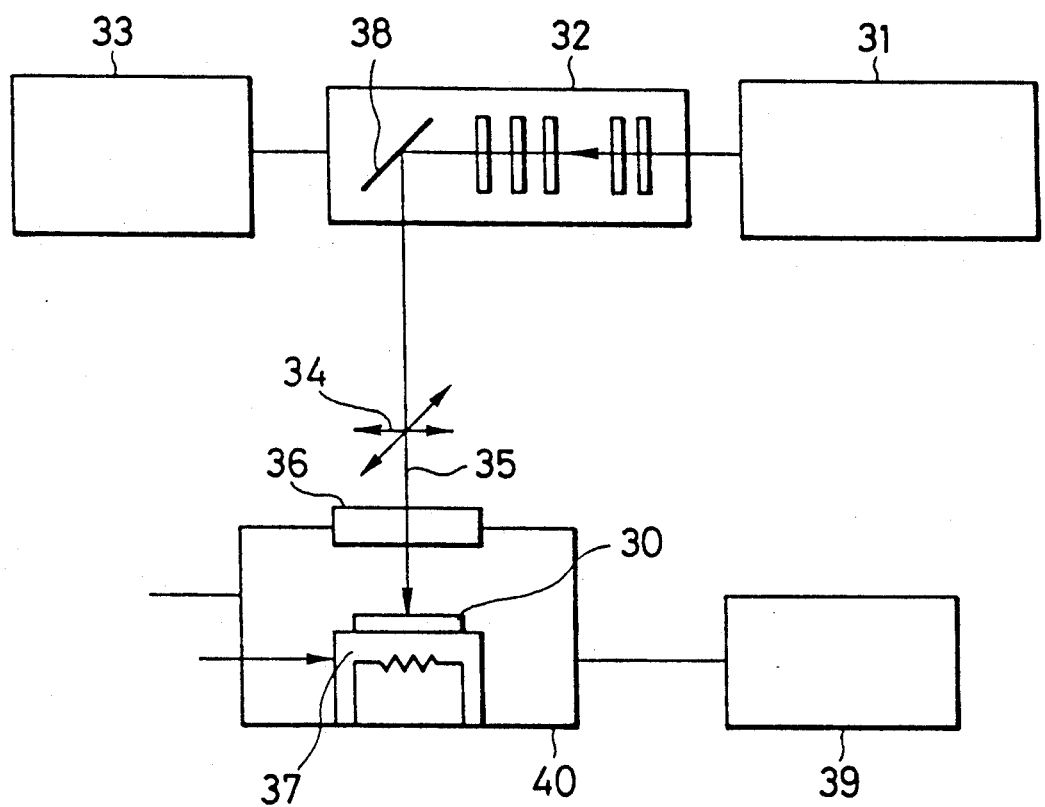
FIG. 1 is a diagram showing the configuration of a laser annealing device used in the present invention.

In the present invention, impurities are implanted in boron nitrides on a silicon substrate, in boron nitrides on a diamond, or in the upper part or the inside of boron nitrides only, using ion implantation.

The laser beam has a pulse width of not more than 1 msec. The pulse width of the laser beam is preferably 200 nsec. or lower, more preferably 5 to 200 nsec.

The boron nitrides in which these impurities are implanted are placed in a chamber whose inside is maintained at a reduced pressure not higher than $10^{-5}$ torr or placed in an atmosphere of an inert gas or hydrogen gas of a purity of 4N or greater. A laser beam is then directed onto the region in which the impurities have been implanted, so that defects in the lattice are reduced or eliminated and the added impurities are activated.

A pulsed laser beam in the 70 to 500 nm range, preferably 260 nm or lower (corresponding to a light energy of 4.8 eV or greater) may be used as the laser beam of the present invention.

The part which is subjected to the laser beam is heated to a temperature of 1400 degrees Centigrade or less by an auxiliary heating means, whereby in order to prevent the gathering of impurities such as beryllium, silicon, or the like in the boron nitrides, the laser beam is emitted when the substrate temperature is in the range of −196 to 1400 degrees Centigrade, for example at room temperature.

In the method of the present invention, the elements in group IIa in the periodic table, typically beryllium, or the elements in group IVb, e.g. carbon, silicon, germanium, or the like conventionally known as impurities, were added as impurities by ion implantation.

The boron nitrides into which impurities are implanted by ion implantation may be boron nitrides only, boron nitrides in the form of films or single crystals formed on a semiconductor of silicon or the like, or boron nitrides in the form of films or granules formed on a ceramic, for example a silicon nitride substrate. For example, in the case where a boron nitride layer is formed on a silicon substrate, silicon components of the substrate enters into the boron nitride layer so that the boron nitride layer becomes N-type. In this case beryllium is added in the N-type boron nitride layer by ion implantation. A doped region into which impurities are added by ion implantation is provided in a region of the upper section of the silicon nitride layer. Simultaneously with the formation of the doped region (impurity region), the region has been damaged by the ion implantation, such that an amorphous layer or a layer formed partly of amorphous or graphite component is formed in the region.

For this reason, optical annealing is performed here using an excimer laser beam, which is an annealing method for a non-equilibrium system, so that the impurities are activated, whereby defects are removed and deformation of lattice relieved.

As an application of the present invention, a pair of electrodes is provided both on a boron nitride region wherein the impurities have been implanted and laser annealing performed, and on a rear surface of a boron nitride region to which no impurities have been added, as shown in FIG. 3. When the electronic device is used as a light emitting device, for example a visible light emitting device, pulse currents or DC currents are made to flow between the electrodes.

A laser of $F_2$ (157 nm in wave length), ArF (193 nm in wave length), KrCl (222 nm in wave length) and the like with a pulse width of 5 to 200 nsec. can be used. The number of pulses is in the 1 to 30 PPS range, for example, 10 PPS (pulse per second). At the same time, the substrate is scanned at a rate of 1 to 5 mm/sec.

By the laser beam of the present invention, impurities are substituted for nitrogens or borons in the boron nitride layer since the laser annealing by such laser beam is a non-equilibrium annealing.

EMBODIMENT NO. 1

FIG. 3 shows an embodiment of the electronic device of the present invention.

Figure 2:
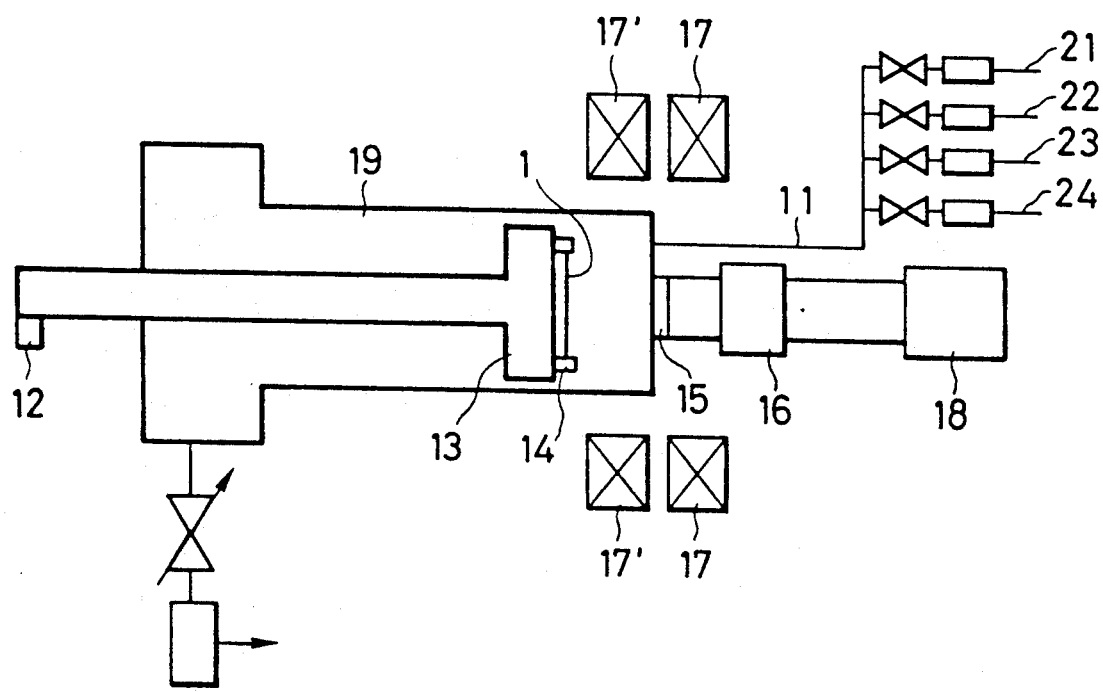
FIG. 2 is a diagram showing one example of a microwave device with a magnetic field for forming the boron nitrides of the present invention.

FIG. 2 illustrates the configuration of a device for forming a boron nitride single crystal or polycrystal (what is called CBN, that is boron nitrides comprised of cubic system crystals) of the electronic device of the present invention.

Impurities were selectively implanted by ion implantation into a boron nitride layer formed by means of a microwave CVD device with a magnetic field. The doped region containing these impurities was annealed by a laser annealing device using an excimer laser shown in FIG. 1. Specifically, as shown in FIG. (A), a single crystal or polycrystal boron nitride layer 2 was formed on a boron nitride substrate, diamond substrate, or silicon semiconductor substrate 1. The boron nitride layer 2 was formed using the microwave CVD device with a magnetic field. The method for forming a film using the microwave CVD device with a magnetic field has been disclosed in Japanese Patent Application S61-292859, "Method of Forming a Thin Film," (filed on Dec. 8, 1986, by the inventor of the present invention).

The formation of the boron nitride layer of the present invention is outlined below.

A silicon nitride substrate or a single crystal silicon substrate 1 was placed in the microwave plasma CVD device with a magnetic field (referred to as the plasma CVD device hereinafter). The plasma CVD device comprises a microwave generator 18, an attenuator 16, a quartz window 15, and a reaction chamber 19, and operates at a frequency of 2.45 GHz to a maximum energy of 10 KW in the reaction chamber 19. Using Helmholtz coils with a magnetic field 17, 17', a maximum of 2.2 KG (kilogauss) was added to form a resonant plane of 875 gauss. The substrate 1 inside these coils was held on a holder 13 by a substrate restrainer 14.

Figure 3A:
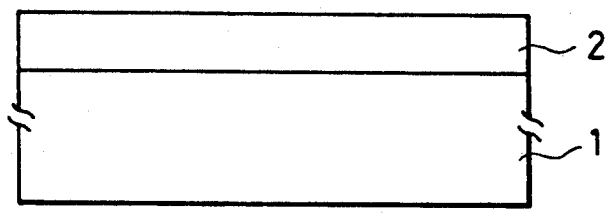
FIG. 3(A) to FIG. 3(C) are a diagram showing an example of a boron nitride electronic device fabricated using the method of the present invention, specifically in a step of the method, respectively.

A substrate position adjusting mechanism 12 was used to adjust the position of the substrate 1 in the reaction chamber 19, and the reaction chamber was evacuated to a pressure of $10^{-3}$ to $10^{-6}$ torr. In the present invention, following this, diborane ($B_2H_6$), organic boron 24, e.g. trimethyl boron ($B(CH_3)_3$) and ammonia ($NH_3$) or nitrogen ($N_2$) 23 diluted with hydrogen 21 in the range of 0.4 to 2 volume ratio (For example, volume ratio 1.0 corresponds to a ratio $B_2H_6:H_2=1:1$.), for example 0.7 volume ratio, was introduced. As necessary, an N-type impurity monosilane ($SiH_4$) was introduced from a system 22, so that an N-type boron nitride layer 2 was formed as shown in FIG. 3(A). For example $B_2H_6$ and $NH_3$ were introduced at a ratio $B_2H_6:NH_3=1:1$ and diluted with hydrogen in the range of 0.002 to 0.1 volume ratio.

The pressure was in the range of 0.01 to 30 torr, for example 0.26 torr. A magnetic field of 2.2 KG (kilogauss) was applied to obtain 875 gauss at the substrate position or around it. A 5 KW microwave was applied, and the substrate was heated to a temperature of 400 to 1400 degrees Centigrade, for example 1000 degrees Centigrade by the microwave energy and by thermal energy from a heater provided in the substrate holder.

As a result, boron and nitrogen were broken down into plasma by the microwave energy and boron nitride crystals grew on the substrate, and single crystal or polycrystal boron nitride layer 2 comprised of cubic system crystals was deposited to a thickness of 0.5 to 5 microns, for example, an average thickness of 1.3 microns (in the film forming time of three hours) as shown in FIG. 3(A).

As shown in FIG. 3(A), when the substrate 1 was made of silicon, a film of partly alloyed boron nitride was formed on the substrate 1, and silicon was autodoped to form an N-type CBN.

Figure 3B:
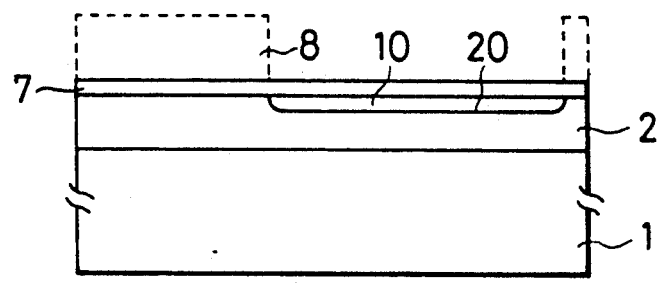

Next, as shown in FIG. 3(B), a silicon nitride film 7 was formed to a thickness of 0.5 microns and a photoresist 8 was formed to a thickness of 3 microns on the boron nitride layer 2.

Using ion implantation, and using the photoresist and the silicon nitride film 7 as a mask, beryllium was implanted as impurities in the boron nitride layer 2 at an acceleration voltage of 20 to 300 KeV, so that a doped region 10 (an impurity region 10) was selectively formed. These impurities were implanted at a comparatively moderate density of $1 \times 10^{16}$ to $5 \times 10^{19}$ cm$^{-3}$.

The photoresist and the silicon nitride film were then removed.

FIG. 1 shows the main configuration of the laser annealing device.

Laser annealing was performed with this device. First, the substrate with the boron nitride layer in which a doped region 10 was formed was positioned on a holder 37 in a chamber 40 after forming the device up to FIG. 3(B). A heater was provided in the holder 37. The laser beam from an excimer laser 31 (KrF 248 nm) was directed onto a substrate 30 via an optical system 32 through a quartz window 36. The laser beam 35 was scanned in the X or Y direction 34 using an optical system scanner 33. The chamber 40 was evacuated to a vacuum of $1 \times 10^{-6}$ to $1 \times 10^{-10}$ torr using a turbo-molecular pump.

The energy of the excimer laser was adjusted to the range of 30 to 500 mJ/cm$^2$. The pulse frequency was from 1 to 30 PPS (for example, 200 mJ/cm$^2$, 10 PPS). The pulse width was from 5 to 50 nsec. In addition, the laser beam was scanned at a speed in the range from 1 to 5 mm/sec. The laser beam was 5 to 10 mm square in size. Because the boron nitride layer was radiated with the laser beam in a vacuum, there was no reaction with oxygen on the surface of the boron nitride layer. This was a desirable situation.

If the bottom of this boron nitride layer is in direct contact with the silicon substrate, the boron nitride layer can easily react with the silicon of the substrate. And an ohmic contact of N$^+$ type can be formed at an interface therebetween.

Because the optical energy 5 eV corresponding to the wave length of the laser beam, 248 nm, is close to the optical energy gap of a boron nitride, it is possible to increase the light absorption in the boron nitride. Because optical energy band gaps of the lattice defects are even smaller from 2 to 4 eV, energy is concentrated in these defects, so that it is possible to reduce or eliminate clusters of micro defects by cure-annealing such defects in a non-equilibrium state.

The surface of the substrate was positioned perpendicular to the optical axis of the laser beam. However, by directing the optical axis of the laser beam parallel to substrate surface or at an angle to the substrate surface so that all the emitted laser beam is adequately absorbed in the boron nitride layer, specifically, by causing all the laser beam to be absorbed in the boron nitride layer only, a temperature increase in the underlying substrate of a material which does not have a high melting point, in other words, has no non-oxidized ceramic on the upper surface of the silicon substrate, is effectively prevented and a laser annealing of the boron nitride layer is effectively performed.

During annealing, 4N helium or argon (purity 99.99% or greater) was used as the inert gas at a temperature of −197 to 1400 degrees Centigrade.

In this way, it was possible to have a PN junction 20 as shown in FIG. 3.

Figure 3C:
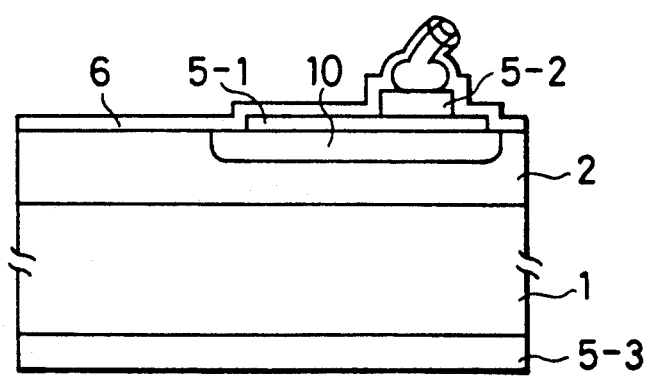

As shown in FIG. 3(C), electrodes 5-1, 5-2, were formed by a vacuum evaporation or by a sputtering method on the boron nitride layer 2. A transparent conductive layer was formed as the electrode 5-1 and an aluminum electrode 5-2 was formed thereon. In addition, the electrode 5-2 was wire bonded, and a silicon nitride film 6 was generally formed to provide double functions as a protective film and reflection reducing film.

In addition another aluminum electrode 5-3 was formed on a rear surface of the substrate 1.

Therefore, as shown in FIG. 3(C), an electrical system comprising the lower electrode 5-3, N-type boron nitride 2, the doped region formed in the P-type boron nitride, and the upper transparent electrode 5-2 was formed, so that it was possible to obtain a structure in which ultraviolet or blue light was generated and emitted to the outside through the PN junction 20 at a lower applied voltage of as low as 2 to 10 V.

In the structure in FIG. 3(C), a voltage in the range of 2 to 10 V, for example, 5 V (DC or AC with a frequency not more than 100 Hz and a Duty Ratio of 1) was applied between the upper and lower electrodes. If laser annealing of ultraviolet light is not performed, the necessary voltage for light emission would become a high voltage in the range of 70 to 200 V because of a large number of recombination centers in the doped region 10. In addition, light emitted was not pure blue, but inclined to contain green. However, when laser annealing was used according to the present invention, the applied voltage was lowered to a practical level and ultraviolet or blue light was generated from the doped region. A strength of 18 candela/m$^2$ was obtained, and the peak wave length was 400 nm, which corresponds to ultraviolet or blue light.

A feature of this embodiment of the present invention is that a structure is simple because the electric current flows in a longitudinal direction. However, because two types of impurities (Be and Si) are mixed in the region 10, the amount of dope and the like in ion implantation must be large, which is not necessarily good for mass production.

Conventionally, even when it was possible to add impurities into a boron nitride layer by ion implantation when forming a film, it was impossible to precisely activate the impurities added to the boron nitride layer. In the present invention, however, because the impurities are added by ion implantation and laser annealed, the added impurities can be activated. Then, by making uniform the amount of dope, it is possible to produce an electronic device with extremely high controllability.

In the above embodiments, the case where one light emitting boron nitride device was fabricated has been shown. However, transistors, heat-resisting diodes (rectifying devices), and integrated electronic devices can be provided on a single substrate by the use of a plurality of the boron nitride devices. After completing them, by scribing and breaking them, individual or integrated light emitting devices can be effectively provided. In addition, diodes, transistors, resistors, capacitors, and the electronic devices of the present invention may be made from the boron nitride in the form of a composite integrated electronic device, if necessary by the use of a silicon semiconductor formed on or under the boron nitride.

Since other modification and changes (varied to fit particular operating requirements and environments) will be apparent to those skilled in the art, the invention is not considered limited to the examples chosen for purposes of disclosure, and covers all changes and modifications which do not constitute departures from the true spirit and scope of this invention.

What is claimed is:

1. A method for manufacturing an electronic device comprising the steps of:
    forming a boron nitride layer on a substrate;
    forming a mask pattern on said boron nitride layer;
    forming an impurity region in said boron nitride layer by doping at least a portion of said boron nitride layer with impurities utilizing said mask pattern; and annealing said impurity region by radiating said impurity region with a laser beam in a non-oxidizing atmosphere.

2. The method for manufacturing an electronic device in claim 1 wherein said impurity region is formed by ion implantation.

3. The method for manufacturing an electronic device in claim 1 wherein said non-oxidizing atmosphere is maintained at a reduced pressure from $1 \times 10^{-6}$ to $1 \times 10^{-10}$ torr.

4. The method for manufacturing an electronic device in claim 1 wherein said non-oxidizing atmosphere comprises an inert gas selected from the group consisting of helium, neon, argon, krypton, xenon, radon.

5. The method for manufacturing an electronic device in claim 1 wherein said non-oxidizing atmosphere comprises a hydrogen gas.

6. The method for manufacturing an electronic device in claim 1 wherein said substrate is maintained at a temperature from liquid nitrogen temperature to 1400° C. during said annealing step.

7. The method for manufacturing an electronic device in claim 1 wherein said substrate is made from silicon.

8. The method for manufacturing an electronic device in claim 7 wherein said boron nitride layer reacts with said silicon at an interface therebetween to form an ohmic contact at said interface.

9. The method for manufacturing an electronic device in claim 1 wherein a wavelength of said laser beam is from 70 to 500 nm.

10. The method for manufacturing an electronic device in claim 1 wherein said impurities are elements selected from the group consisting of IIa and IVb elements of the periodic table.

11. The method for manufacturing an electronic device in claim 1 wherein said laser beam is emitted from an excimer laser selected from the group consisting of a KrF excimer laser, an $F_2$ excimer laser, an ArF excimer laser, and a KrCl excimer laser.

12. The method for manufacturing an electronic device in claim 1 wherein said laser beam is pulsed laser beams.

13. The method for manufacturing an electronic device in claim 12 wherein said pulsed laser beams are emitted at a pulse width not more than 1 msec.

14. The method for manufacturing an electronic device in claim 12 wherein said pulsed laser beams are emitted at a frequency of 1 to 30 pulse per second.

15. A method for manufacturing an electronic device comprising the steps of:
forming an impurity region in a boron nitride matter by doping at least a portion of said boron nitride matter with impurities;
exposing said impurity region to a pulsed laser light.

* * * * *